(12) United States Patent
Itonaga et al.

(10) Patent No.: US 10,141,209 B2
(45) Date of Patent: Nov. 27, 2018

(54) PROCESSING GAS GENERATING APPARATUS, PROCESSING GAS GENERATING METHOD, SUBSTRATE PROCESSING METHOD, AND STORAGE MEDIUM

(71) Applicant: Tokyo Electron Limited, Tokyo (JP)

(72) Inventors: Masashi Itonaga, Kumamoto (JP); Masanobu Watanabe, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 365 days.

(21) Appl. No.: 14/630,806

(22) Filed: Feb. 25, 2015

(65) Prior Publication Data

US 2015/0246329 A1 Sep. 3, 2015

(30) Foreign Application Priority Data

Feb. 28, 2014 (JP) .................................. 2014-038982

(51) Int. Cl.
| | | |
|---|---|---|
| *H01L 21/67* | (2006.01) | |
| *H01L 21/02* | (2006.01) | |
| *C23C 16/448* | (2006.01) | |
| *C23C 16/56* | (2006.01) | |

(52) U.S. Cl.
CPC .. *H01L 21/67248* (2013.01); *H01L 21/67017* (2013.01); *C23C 16/4481* (2013.01); *C23C 16/4482* (2013.01); *C23C 16/56* (2013.01); *H01L 21/0201* (2013.01); *H01L 21/02656* (2013.01)

(58) Field of Classification Search
CPC . C23C 16/4482; C23C 16/4481; C23C 16/56; H01L 21/67248; H01L 21/67017; H01L 21/02656; H01L 21/0201
See application file for complete search history.

(56) References Cited

U.S. PATENT DOCUMENTS

| | | | | |
|---|---|---|---|---|
| 4,861,524 | A | * 8/1989 | Sielaff ............... | C03B 37/01413 261/121.1 |
| 5,803,938 | A | * 9/1998 | Yamaguchi .......... | B01D 1/0076 118/726 |
| 6,218,212 | B1 | * 4/2001 | Saito ..................... | C23C 16/306 118/719 |

(Continued)

FOREIGN PATENT DOCUMENTS

| | | | | |
|---|---|---|---|---|
| DE | 3708967 | A1 * | 10/1988 | ....... C03B 37/01413 |
| EP | 0503382 | A1 * | 9/1992 | ........... C03C 17/002 |

(Continued)

*Primary Examiner* — Amber R Orlando
*Assistant Examiner* — Stephen Hobson
(74) *Attorney, Agent, or Firm* — Abelman, Frayne & Schwab

(57) ABSTRACT

The present disclosure provides an apparatus for generating a processing gas by bubbling a raw material liquid with a carrier gas. The processing gas generated by the bubbling is taken out from a vapor-phase portion above a liquid-phase portion of the raw material liquid through a taking-out unit. A first temperature adjusting unit performs a temperature adjustment of the liquid-phase portion and a second temperature adjusting unit performs a temperature adjustment of the vapor-phase portion such that the temperature of the vapor-phase portion is higher than the temperature of the liquid-phase portion.

14 Claims, 12 Drawing Sheets

(56) References Cited

U.S. PATENT DOCUMENTS

| | | | |
|---|---|---|---|
| 6,358,323 B1 * | 3/2002 | Schmitt | C23C 16/4486 118/715 |
| 8,555,809 B2 * | 10/2013 | Woelk | B01B 1/005 118/663 |
| 8,828,143 B2 * | 9/2014 | Simons | B08B 7/0021 134/1 |
| 8,900,953 B2 * | 12/2014 | Higashi | C01B 33/02 257/E21.09 |
| 9,598,766 B2 * | 3/2017 | Birtcher | C23C 16/4412 |
| 2005/0000427 A1 * | 1/2005 | Lee | C23C 16/4481 118/715 |
| 2007/0120275 A1 * | 5/2007 | Liu | C23C 16/4481 261/100 |
| 2009/0151631 A1 * | 6/2009 | Minamida | H01L 21/67115 118/663 |
| 2010/0020297 A1 * | 1/2010 | Inatomi | G03F 7/40 355/30 |
| 2013/0092241 A1 * | 4/2013 | Sakata | C23C 16/4482 137/1 |
| 2013/0111928 A1 * | 5/2013 | Bernert, Sr. | F17C 13/00 62/50.2 |
| 2015/0056820 A1 * | 2/2015 | Behnke | H01L 21/67248 438/782 |
| 2016/0372341 A1 * | 12/2016 | Kobayashi | H01L 21/67248 |

FOREIGN PATENT DOCUMENTS

| | | | | |
|---|---|---|---|---|
| EP | 0696472 A1 * | 2/1996 | | B01J 4/008 |
| EP | 3081668 A1 * | 10/2016 | | C23C 16/45561 |
| GB | 787076 A * | 12/1957 | | C23C 16/4481 |
| JP | 02-198622 A | 8/1990 | | |
| JP | 2003-340265 A | 2/2003 | | |
| JP | 2009-147261 A | 7/2009 | | |
| JP | 2010284628 A * | 12/2010 | | |
| WO | WO-2006099619 A2 * | 9/2006 | | C23C 16/4482 |
| WO | WO-2007044208 A2 * | 4/2007 | | C23C 16/4482 |
| WO | WO-2010056576 A1 * | 5/2010 | | C23C 16/4481 |
| WO | WO-2010083510 A1 * | 7/2010 | | C23C 16/06 |
| WO | WO-2010086805 A1 * | 8/2010 | | C23C 16/4482 |

* cited by examiner

PROCESSING GAS GENERATING APPARATUS, PROCESSING GAS GENERATING METHOD, SUBSTRATE PROCESSING METHOD, AND STORAGE MEDIUM

CROSS-REFERENCE TO RELATED APPLICATIONS

This application is based on and claims priority from Japanese Patent Application No. 2014-038982, filed on Feb. 28, 2014, with the Japan Patent Office, the disclosure of which is incorporated herein in its entirety by reference.

TECHNICAL FIELD

The present disclosure relates to a technique of generating a processing gas for processing a substrate.

BACKGROUND

In a photolithography step which is one of semiconductor manufacturing steps, a resist is coated in a film shape on a surface of a semiconductor wafer (hereinafter, referred to as a "wafer") serving as a substrate, and the resultant resist film is exposed in a predetermined pattern and then developed to form a resist pattern.

In the photolithography step, minute unevenness may be present on the surface of the resist pattern developed by a developer, and when an etching processing is performed in the subsequent etching step, the unevenness may adversely affect line width uniformity of the pattern. Therefore, a smoothing processing has been suggested to improve line edge roughness (LER) of the resist pattern or line width roughness (LWR) of the pattern.

The smoothing processing is a processing of exposing the resist pattern to an atmosphere of an organic solvent vapor capable of dissolving the resist so as to swell the surface layer portion of the resist pattern with the solvent vapor. Accordingly, the unevenness of the surface layer portion is dissolved in the organic solvent and smoothed, thereby improving the roughness of the surface of the pattern. Thereafter, a heating processing is performed to remove the organic solvent by evaporation.

Japanese Patent Laid-Open Publication No. 2009-147261 discloses a solvent vapor source that supplies a solvent vapor towards a housing to perform a smoothing processing, the solvent vapor being vaporized by bubbling a liquid solvent stored in a storage tank including a heater with a nitrogen gas (see, e.g., paragraphs 0047 and 0049, and FIG. 8). However, when the solvent vapor in the storage tank is cooled by the nitrogen gas to a temperature lower than that of the liquid solvent, the solvent in the vapor turns back to liquid, which causes variation of the concentration of the solvent vapor supplied to a substrate.

SUMMARY

The present disclosure provides an apparatus for generating a processing gas by bubbling a raw material liquid with a carrier gas. The apparatus includes a raw material liquid tank configured to store the raw material liquid; a carrier gas supplying unit configured to supply the carrier gas to the raw material liquid in the raw material liquid tank; a taking-out unit configured to take out the processing gas generated by the bubbling from a vapor-phase portion above a liquid-phase portion which is a region where the raw material liquid is stored in the raw material liquid tank; a first temperature adjusting unit configured to perform a temperature adjustment of the liquid-phase portion; and a second temperature adjusting unit configured to perform a temperature adjustment of the vapor-phase portion such that the temperature of the vapor-phase portion is higher than the temperature of the liquid-phase portion.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
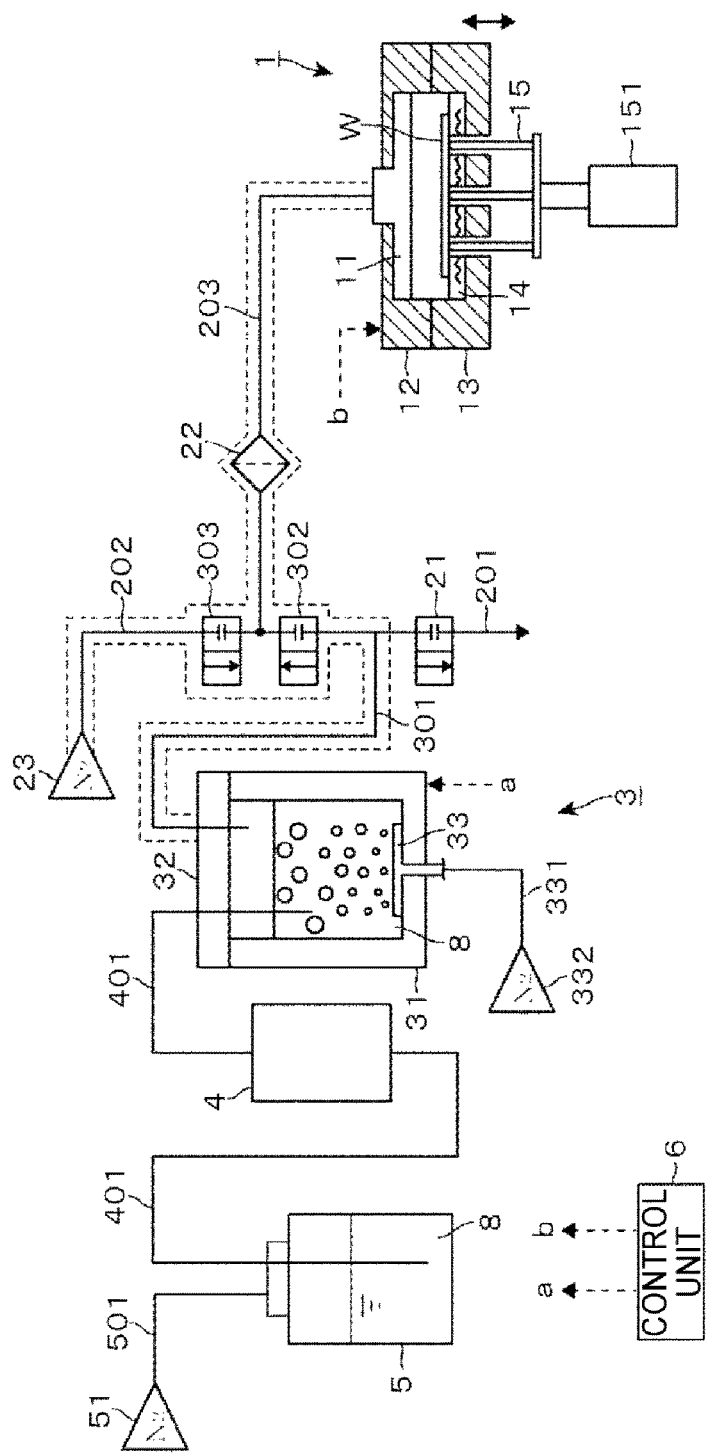
FIG. 1 is a solvent vapor supply system diagram including a solvent vapor generating apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in consideration of such problems and an object of the present disclosure is to provide a processing gas generating apparatus capable of supplying a stable amount of processing gas to a substrate, a processing gas generating method, a substrate processing method, and a storage medium storing the processing gas generating method.

In an exemplary embodiment, the present disclosure provides an apparatus for generating a processing gas by bubbling a raw material liquid with a carrier gas. The apparatus includes a raw material liquid tank configured to store the raw material liquid; a carrier gas supplying unit configured to supply the carrier gas to the raw material liquid in the raw material liquid tank; a taking-out unit configured to take out the processing gas generated by the bubbling from a vapor-phase portion above a liquid-phase portion which is a region where the raw material liquid is stored in the raw material liquid tank; a first temperature adjusting unit configured to perform a temperature adjustment of the liquid-phase portion; and a second temperature adjusting unit configured to perform a temperature adjustment of the vapor-phase portion such that the temperature of the vapor-phase portion is higher than the temperature of the liquid-phase portion.

The above-mentioned apparatus further includes a raw material liquid supplying unit configured to supply the raw material liquid into the raw material liquid tank. The raw material liquid supplying unit includes a raw material liquid temperature adjusting unit configured to adjust a temperature of the raw material liquid such that the temperature of the raw material liquid supplied to the raw material liquid tank approaches the temperature of the liquid-phase portion.

The raw material liquid temperature adjusting unit includes a preliminary temperature adjusting unit configured to cause the temperature of the raw material liquid to approach the temperature of the liquid-phase portion at the outside of the raw material liquid tank. The raw material liquid supplying unit includes a supply pipe, through which the raw material liquid supplied to the raw material tank flows. The preliminary temperature adjusting unit is configured to cause temperature of the raw material liquid flowing through the supply pipe to approach the temperature of the liquid-phase portion, using the first temperature adjusting unit.

The raw material liquid supplying unit includes a supply pipe, through which the raw material liquid supplied to the raw material tank flows. The raw material liquid temperature adjusting unit includes a heat exchanging unit constituted by a terminal end side of the supply pipe disposed to be immersed in the raw material liquid of the liquid-phase portion and configured to perform heat exchange between the raw material liquid in the supply pipe and the liquid-phase portion such that the temperature of the raw material liquid supplied to the raw material liquid tank approaches the temperature of the liquid-phase portion. The terminal end side of the supply pipe constituting the heat exchanging unit is formed in a spiral shape extending vertically in the raw material liquid tank. Further, the terminal end side of the supply pipe constituting the heat exchanging unit is made of a resin.

The above-mentioned apparatus further includes a liquid-phase temperature detecting unit configured to detect the temperature of the liquid-phase portion; and a vapor-phase temperature detecting unit configured to detect the temperature of the vapor-phase portion. The first temperature adjusting unit performs the temperature adjustment such that the detection temperature of the liquid-phase temperature detecting unit becomes a first temperature serving as a temperature set value of the liquid-phase portion, and the second temperature adjusting unit performs the temperature adjustment such that the detection temperature of the vapor-phase temperature detecting unit becomes a second temperature serving as a temperature set value of the vapor-phase portion.

The first temperature adjusting unit performs the temperature adjustment of the liquid-phase portion through at least one of the side and the bottom of the raw material liquid tank, and the second temperature adjusting unit performs the temperature adjustment of the vapor-phase portion through the top of the raw material liquid tank.

The above-mentioned apparatus further includes a liquid level meter configured to detect a height position of a liquid level of the liquid-phase portion. When the height position of the liquid level detected by the liquid level meter reaches a preset lower limit, the raw material liquid supplying unit supplies the raw material liquid to the raw material liquid tank.

In another exemplary embodiment, the present disclosure provides an apparatus for generating a processing gas by bubbling a raw material liquid with a carrier gas. The apparatus includes a raw material liquid tank configured to store the raw material liquid; a carrier gas supplying unit configured to supply the carrier gas to the raw material liquid in the raw material liquid tank; a taking-out unit configured to take out a processing gas generated by the bubbling from a vapor-phase portion above a liquid-phase portion which is a region where the raw material liquid is stored in the raw material liquid tank; a raw material liquid supplying unit provided with a supply pipe, through which the raw material liquid supplied to the raw material tank flows; and a heat exchanging unit constituted by a terminal end side of the supply pipe disposed to be immersed in the raw material liquid of the liquid-phase portion and configured to perform heat exchange between the raw material liquid in the supply pipe and the liquid-phase portion to cause the temperature of the raw material liquid supplied to the raw material liquid tank to approach the temperature of the liquid-phase portion.

In still another exemplary embodiment, the present disclosure provides a method of generating a processing gas for processing a substrate. The method includes supplying a carrier gas to a raw material liquid stored in a raw material liquid tank that is partitioned from the outside; taking out the processing gas generated by bubbling, from a vapor-phase portion above a liquid-phase portion which is a region where the raw material liquid is stored in the raw material liquid tank; performing a temperature adjustment of the raw material liquid of the liquid-phase portion; and performing a temperature adjustment of the processing gas such that a temperature of the vapor-phase portion is higher than the temperature of the liquid-phase portion.

The above-mentioned method further includes adjusting a temperature of the raw material liquid such that the temperature of the raw material liquid supplied to the raw material liquid tank approaches the temperature of the liquid-phase portion.

The adjusting of the temperature of the raw material liquid includes adjusting the temperature of the raw material liquid to approach the temperature of the liquid-phase portion.

The adjusting of the temperature of the raw material liquid includes performing heat exchange between the raw material liquid flowing at a terminal end of a supply pipe disposed to be immersed in the liquid-phase portion and the liquid-phase portion such that the temperature of the raw material liquid supplied to the raw material liquid tank approaches the temperature of the liquid-phase portion, wherein the raw material liquid supplied to the raw material tank flows through the supply pipe.

In yet another exemplary embodiment, the present disclosure provides a substrate processing method, comprising disposing a substrate in a processing container; and supplying a processing gas generated by the above-mentioned method to process the substrate. The processing gas is a solvent vapor used for a processing on a substrate having a pattern mask formed thereon by exposure and development to improve a roughness of the pattern mask.

In still yet another exemplary embodiment, the present disclosure provides a storage medium storing a computer program used in an apparatus for generating a processing gas for processing a substrate. The program includes steps organized to perform the above-mentioned method.

According to the present disclosure, when taking out the processing gas generated by bubbling the raw material liquid stored in the raw material liquid tank with the carrier gas, the temperature adjustment is performed such that the temperature of the vapor-phase portion is higher than that of the liquid-phase portion. Therefore, re-liquefaction of the raw material due to temperature drop of the processing gas may be suppressed, and hence, a stable amount of the processing gas may be supplied to the substrate.

Hereinafter, an exemplary processing gas generating apparatus according to an exemplary embodiment will be described with respect to an application example of a smoothing processing apparatus 1, which performs a smoothing processing to improve the roughness of a surface of a pattern formed on a wafer W (substrate) after development, to a solvent vapor generating apparatus 3, which supplies a solvent vapor serving as a processing gas.

As illustrated in the supply system diagram of FIG. 1, the smoothing processing apparatus 1 is supplied with solvent vapor obtained by bubbling a liquid solvent 8 serving as a raw material liquid in the solvent vapor generating apparatus 3. The solvent vapor generating apparatus 3 is supplied with the liquid solvent 8 preheated by a solvent heating unit 4.

The smoothing processing apparatus 1 includes a processing space formed between a lower chamber 13 configured to be vertically movable and an upper chamber 12 that covers the top of the lower chamber 13, so as to perform a smoothing processing on the wafer W. The lower chamber 13 includes a heating plate 14 provided with a heater so that the wafer W placed on the heating plate 14 is heated to a temperature lower than the boiling point of the solvent vapor and higher than the dew point of the solvent vapor. Then, when the solvent vapor is supplied from a solvent supplying unit 11 provided in the upper chamber 12, a resist pattern formed on the wafer W is swollen by the solvent, thereby performing the smoothing processing.

Support pins 15, which are moved up and down by an elevating mechanism 151, are provided in the heating plate 14 to project from and retract into the placing surface of the wafer W. As the heat plate 14 is moved down to allow the support pins 15 to project from the placing surface of the heating plate 14, a delivery of the wafer W is performed between the support pins 15 and an external conveying mechanism (e.g., a conveying arm A1 to be described later) at the time of carry-in/out.

The above-mentioned solvent supplying unit 11 has, for example, a shower head structure in which a dispersion plate having a plurality of discharge holes is provided at a lower side of a space where the solvent vapor is diffused. The solvent vapor is supplied from a solvent vapor supply path 203 to the diffusion space.

The solvent vapor supply path 203 is provided with a filter unit 22 to remove particles in the solvent vapor, and connected at the proximal end thereof to a solvent vapor extraction path 301 that extracts the solvent vapor from the solvent vapor generating apparatus 3. The solvent vapor extraction path 301 corresponds to the taking-out unit in the present exemplary embodiment.

Further, the solvent vapor supply path 203 is connected with a purge gas supply path 202 that supplies a purge gas to the processing space, in order to exhaust the solvent vapor in the processing space of the smoothing processing apparatus 1 towards an exhaust path (not illustrated) after the smoothing processing of the wafer W is completed. The purge gas supply path 202 is connected to a purge gas supplying unit 23 that supplies nitrogen gas, which is an inert gas, as a purge gas. An opening/closing valve 303 is provided in the purge gas supply path 202 at the downstream side of the purge gas supplying unit 23.

In the solvent vapor supply path 203 or the purge gas supply path 202, or various units 22, 303 provided therein, a heating unit such as, for example, a tape heater (not illustrated) is provided (as denoted in a state surrounded by the dashed line in FIG. 1) to perform heating such that the temperature of the solvent vapor flowing through the solvent vapor supply path 203 or the temperature of the purge gas supplied to the solvent vapor supply path 203 is higher than the dew point of the solvent vapor supplied from the solvent vapor generating apparatus 3. Further, the solvent vapor extraction path 301 is also provided with a mechanism to heat the solvent vapor. The configuration of the mechanism will be described later.

The solvent vapor extraction path 301 is connected to the solvent generating apparatus 3 through an opening/closing valve 302. An exhaust path 201 including an opening/closing valve 21 is branched from the solvent vapor extraction path 301 positioned between the solvent vapor generating apparatus 3 and the opening/closing valve 302 to exhaust the vapor-phase atmosphere in the solvent vapor generating apparatus 3 to the outside.

The solvent vapor generating apparatus 3 generates the solvent vapor by bubbling the liquid solvent 8 stored in a solvent container 31 with a carrier gas supplied from the bubbling nozzle 33. The solvent container 31 is supplied with the liquid solvent 8 from a liquid solvent supply path 401. The liquid solvent supply path 401 is provided with a solvent heating unit 4 to perform a temperature adjustment (heating) of the liquid solvent 8 in advance. The configurations of the solvent vapor generating apparatus 3 and the solvent heating unit 4 will be described later in detail.

The proximal end of the liquid solvent supply path 401 is immersed into the liquid solvent 8 stored in a replaceable solvent bottle 5. The solvent bottle 5 is connected to a delivery gas supply path 501 and supplied with the delivery gas such as, for example, nitrogen gas from a delivery gas supplying unit 51. Accordingly, the liquid solvent 8 is sent from the solvent bottle 5 to the solvent vapor generating apparatus 3. The solvent bottle 5 or the liquid solvent supply path 401 corresponds to the material liquid supply path of the present exemplary embodiment.

Examples of the organic solvent used in the smoothing processing may include acetone, propylene glycol monomethyl ether acetate (PGMEA), isopropyl alcohol, cyclohexanone, propylene glycol monomethyl ether (PGME), γ-butyrolactone, pyridine, xylene, N-methyl-2-pyrrolidone (NMP), butanol, ethyl lactate, ethanol, 2-heptanone, butyl acetate, methyl isobutyl ketone, diethyl ether, and anisole.

Next, the configurations of the solvent vapor generating apparatus 3 and the solvent heating unit 4 will be described in detail with reference to FIGS. 2 to 4.

Figure 2:
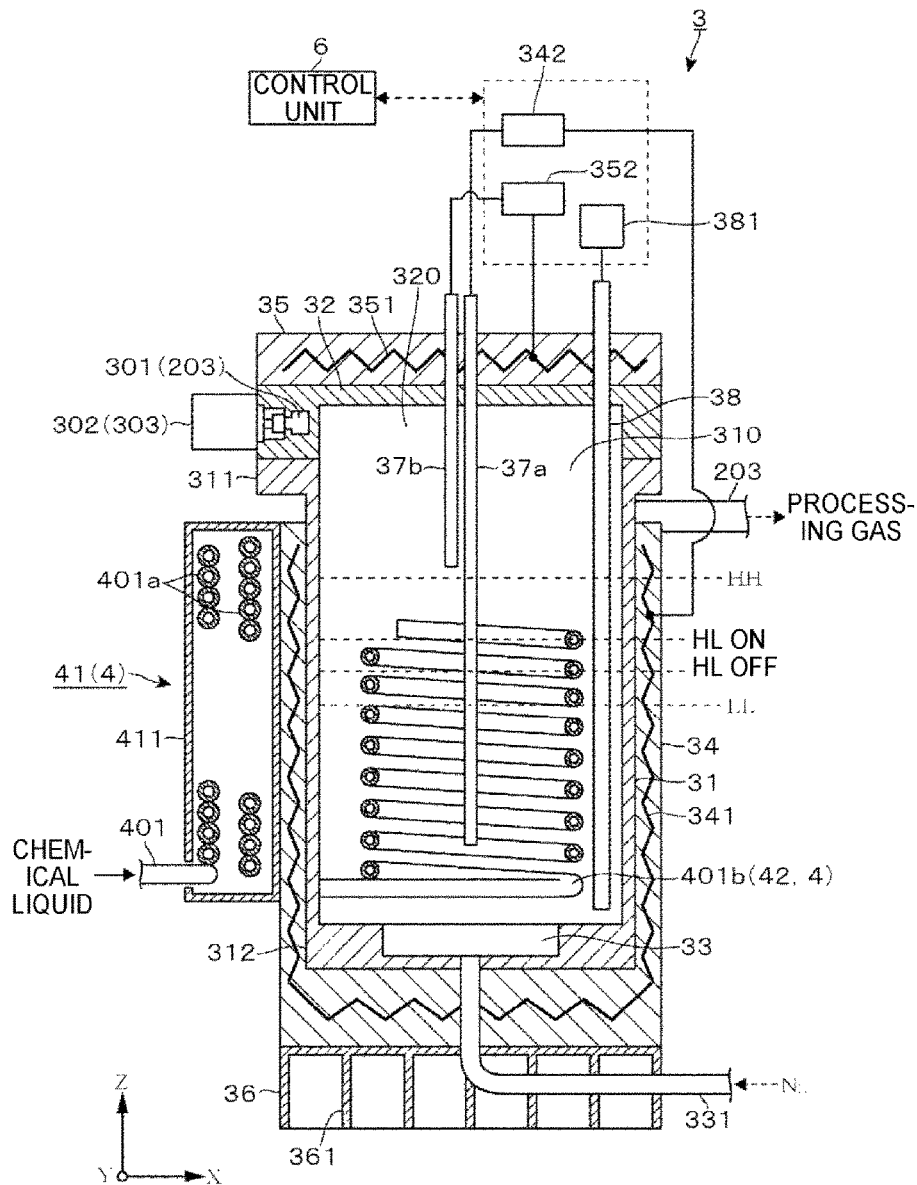
FIG. 2 is a vertical cross-sectional view illustrating a configuration of the solvent vapor generating apparatus.

As illustrated in the vertical cross-sectional view of FIG. 2, the solvent vapor generating apparatus 3 includes the solvent container 31 that stores the liquid solvent 8, and a cover 32 that blocks an opening 310 formed at the upper side of the solvent container 31. The solvent container 31 and the cover 32 constitute the raw material liquid tank comparted from the outside.

The solvent container 31 is constituted by forming a metal member made of, for example, stainless steel in an elongated cylindrical shape. A flange portion 311 is provided around an opening 310 at the upper side of the solvent container 31 to fasten the cover 32 to the solvent container 31 by a bolt (not illustrated). Meanwhile, a recess is formed in a bottom plate 312 at the bottom side of the solvent container 31 to dispose a bubbling nozzle 33 (to be described later). Further, the side wall of the solvent container 31 is made of a metal member having a thickness of several mm (e.g., about 5 mm in this exemplary embodiment), which is relatively thinner than other parts, to enhance heat transfer from a tank heating unit 34 (to be described later) that heats the liquid solvent 8.

The bubbling nozzle 33 plays a role to supply a carrier gas for bubbling into the solvent container 31. For example, the bubbling nozzle 33 has a structure in which the inside is hollow and a dispersion plate is provided on an upper side of a flat disc to disperse and supply the carrier gas from the upper side. The dispersion plate may be constituted by forming a plurality of small holes in a metal or plastic plate, or may be constituted with a porous material such as a porous ceramic.

The bubbling nozzle 33 is connected with a carrier gas supply path 331, and the proximal end thereof is connected to a carrier gas supplying unit 332 that supplies nitrogen gas, which is an inert gas, as the carrier gas (see, e.g., FIG. 1).

As illustrated in FIG. 2, the cover 32 is constituted with a metal member such as stainless steel, and is provided with a recess 320 in the bottom side thereof to communicate with the opening 310 of the solvent container 31.

Figure 3:
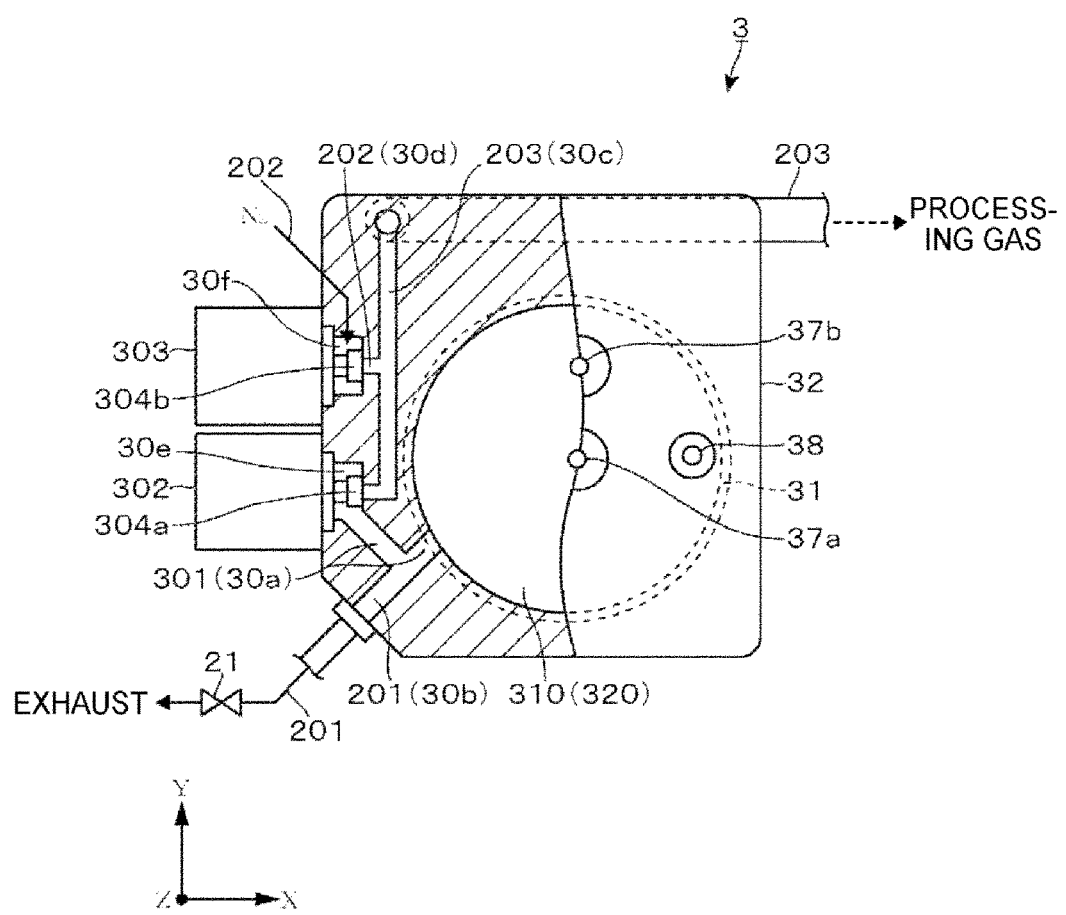
FIG. 3 is a partially cutaway plan view illustrating a cover provided in the solvent vapor generating apparatus.

As illustrated in the partially cutaway plan view of FIG. 3, grooves 30a to 30d constituting a part of the solvent vapor extraction path 301, the exhaust path 201, or the solvent vapor supply path 203 are formed inside the cover 32 by, for example, a cutting processing.

Specifically, the cover 32 is opened towards the recess 320 and includes the groove 30a formed therein, which serves as the solvent vapor extraction path 301. The groove 30b, which serves as the exhaust path 201 to exhaust the gas in the solvent vapor generating apparatus 3 towards the outside, is branched from the groove 30a, and the groove 30b is connected to a pipe including the opening/closing valve 21.

Meanwhile, the exhaust path 201 (the groove 30b) and the branched solvent vapor extraction path 301 (the groove 30a) are connected to a valve chamber 30e that accommodates a valve body 304a of the opening/closing valve 302.

A valve seat is formed on the side wall of the valve chamber 30e to be opened/closed by the valve body 304a. The valve seat is connected with the groove 30c serving as the solvent vapor supply path 203. When the cover 32 is viewed from the top, the solvent vapor supply path 203 (the groove 30c) is formed to extend along one side of the cover 32 and changes the path direction to the lower side in the vicinity of an end portion of the cover 32. Thereafter, the groove 30c passes through the flange portion 311 of the cover 32 or the solvent container 31 to be connected to a pipe member of the solvent vapor supply path 203.

Further, the groove 30d, which serves as the purge gas supply path 202, is branched from the solvent vapor supply path 203 (the groove 30c) between the valve chamber 30e, which is a connecting portion with the solvent vapor extraction path 301, and a position where the path direction is changed to the lower side. The groove 30d is connected to a valve chamber 30f that accommodates a valve body 304d of the opening/closing valve 303. The valve chamber 30f is connected with a pipe constituting the purge gas supply path 202 from the top side of the cover 32. The valve chamber 30f may store nitrogen gas serving as the purge gas from the purge gas supplying unit 23 (see FIG. 1) and supply the nitrogen gas to the smoothing processing apparatus 1 through the solvent vapor supply path 203.

As described above, in the solvent vapor generating apparatus 3 in the present exemplary embodiment, the grooves 30a to 30d, which constitute a part of the respective paths 301, 201, 202, 203, are formed inside the cover 32. Further, the valve bodies 304a, 304b are accommodated in the cover 32 to perform the connection or separation of the paths 301, 201, 202, 203. Therefore, the solvent vapor generating apparatus 3 may be miniaturized, as compared with a case where all the pipes of the paths 301, 201, 202, 203 or all the opening/closing valves 302, 303 are attached to the outside.

Further, as illustrated in FIGS. 2 and 3, a liquid-phase temperature detecting unit 37a that detects the temperature of the liquid solvent 8 (liquid-phase portion) in the solvent container 31, a vapor-phase temperature detecting unit 37b that detects the temperature of the solvent vapor (vapor-phase portion), and a liquid level meter 38 that detects the height position of the liquid level of the liquid solvent 8 are inserted into the cover 32 towards the inside of the solvent container 31.

Here, as illustrated in FIG. 2, the liquid level meter 38 is connected with an output unit 381 that outputs an electric signal indicating the height position of the liquid level of the liquid solvent 8, towards a control unit 6. In the liquid level meter 38 of the present exemplary embodiment, "HL OFF" and "HL ON", which correspond to positions for executing a replenishment start and replenishment stop of the liquid solvent 8 from the solvent bottle 5, and "HH" and "LL" positions for stopping the operations of the solvent vapor generating apparatus 3 with alarm of 'over the liquid level' or 'lack of liquid', are set, respectively.

Further, the solvent vapor generating apparatus 3 includes a tank heating unit 34 and a cover heating unit 35, which independently heat the liquid-phase portion and the vapor-phase portion through the solvent container 31 and the cover 32, respectively, in order to suppress a temperature change in the solvent container 31 when the liquid solvent 8 is vaporized, and stably generate the solvent vapor. Further, a solvent heating unit 4 is provided to suppress a temperature change of the liquid-phase portion when the liquid solvent 8 is replenished from the solvent bottle 5.

Hereinafter, the configurations of these units will be described in detail.

The tank heating unit 34 is configured as a rectangular cylindrical heater block that covers the side wall and the bottom wall of the body portion of the solvent container 31 formed in a cylindrical shape. For example, the tank heating unit 34 has a structure in which a plurality of heaters 341 including, for example, cartridge heaters are embedded in an aluminum body. Each heater 341 is supplied with electric power from an electric power supplying unit 342. The electric power supplying unit 342 increases or decreases the supplying electric power such that the temperature of the liquid-phase portion reaches a predetermined target temperature (e.g., 70° C.), based on the temperature detection result of the liquid-phase portion by the liquid-phase temperature detecting unit 37a.

The tank heating unit 34 corresponds to the first temperature adjusting unit of the present exemplary embodiment, and the target temperature of the liquid-phase portion corresponds to the first temperature.

Further, the tank heating unit 34 is not limited to the configuration to heat both the side wall and the bottom wall of the solvent container 31, but may be configured to heat the liquid phase through at least one of the side wall and the bottom wall.

Further, a heat radiating unit 36 including a plurality of heat radiating fins 361 for heat radiation is provided under the solvent container 31. Cooling air may be sprayed from a cooling air supplying unit (not illustrated) to the heat radiating unit 36, so that the tank heating unit 34 or the liquid solvent 8 inside the solvent container 31 is rapidly cooled, for example, at the time of shutdown of the solvent vapor generating apparatus 3.

Meanwhile, as illustrated in FIG. 2, the cover heating unit 35 is configured as a heater block that covers the top side of the cover 32. In the cover heating unit 35, a plurality of heaters 351 including, for example, cartridge heaters is embedded in an aluminum body formed in a plate shape. Each heater 351 is supplied with electric power from an electric power supplying unit 352. The electric power supplying unit 352 increases or decreases the supplying electric power such that the temperature of the vapor-phase portion reaches a predetermined target temperature (e.g., 73° C.), based on the temperature detection result of the vapor-phase portion by the vapor-phase temperature detecting unit 37b.

The cover heating unit 35 corresponds to the second temperature adjusting unit of the present exemplary embodiment, and the target temperature of the solvent vapor corresponds to the second temperature. Further, the second temperature, which is the target temperature of the solvent vapor, is set to a value higher than the first temperature, which is the target temperature of the liquid solvent 8. Further, the cover heating unit 35 also serves as a heating unit that heats the solvent vapor extraction path 301 or the solvent vapor supply path 203 formed inside the cover 32.

Next, the configuration of the solvent heating unit 4 will be described. As illustrated in FIG. 2, the solvent heating unit 4 includes a preheating unit 41 that preheats the liquid solvent 8 outside the solvent container 31, and an heat exchanging unit 42 that adjusts the temperature of the liquid solvent 8 supplied to the solvent container 31 to approach the temperature of the liquid solvent 8 in the solvent container 31 by heat exchange with the liquid solvent 8 in the solvent container 31. For convenience of illustration, FIG. 1 illustrates the preheating unit 41 and the heat exchanging unit 42 in combination as the solvent heating unit 4. The solvent heating unit 4 corresponds to the raw material temperature adjusting unit of the present exemplary embodiment.

Figure 4:
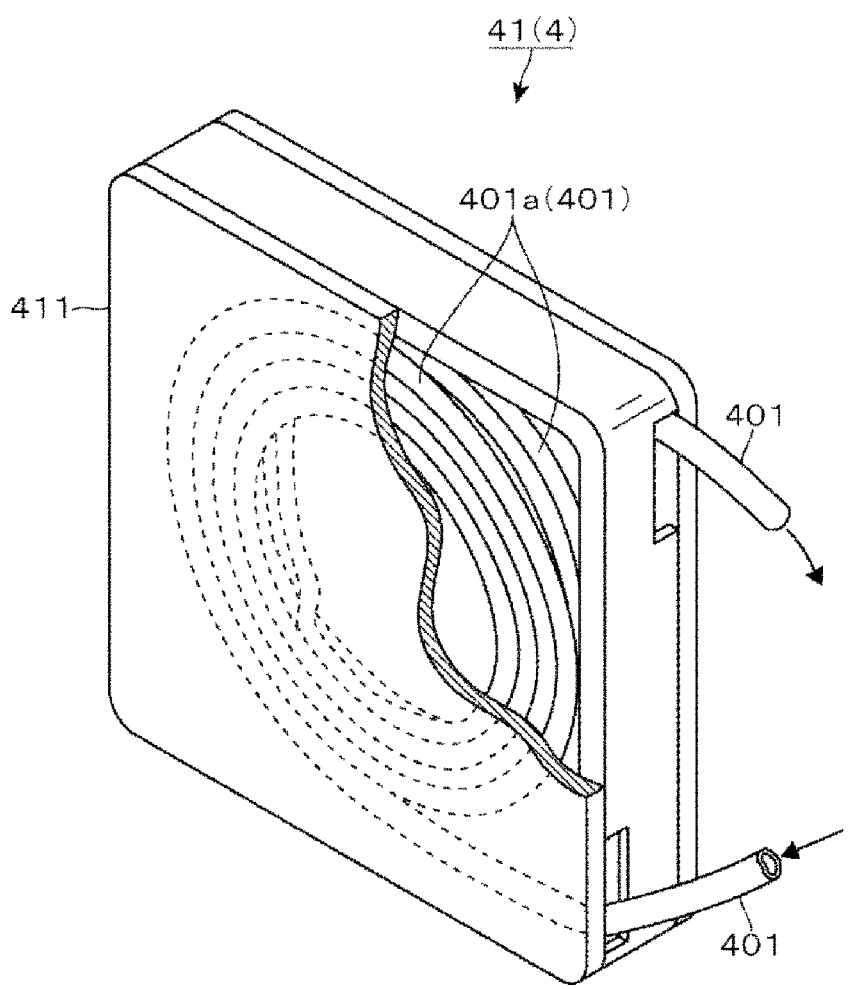
FIG. 4 is a partially cutaway perspective view illustrating a primary heating unit provided in the solvent vapor generating apparatus.

As illustrated in FIGS. 2 and 4, the preheating unit 41 includes a spiral pipe 401a formed by winding a supply pipe made of a fluororesin such as PFA, which constitute a part of the liquid solvent supply path 401, in an Archimedean spiral represented by r=aθ as expressed, for example, in polar coordinates. Since the pipe walls of the spiral pipe 401a arranged inside and outside in the radial direction are in contact with each other, the liquid solvent 8 in the spiral pipe 401a may transfer heat through the wall of the pipe.

In the preheating unit 41 of the present exemplary embodiment, the spiral pipe 401a, in which the liquid solvent 8 flows from the outside to the inside in the radial direction (at the left side in FIG. 2), and the spiral pipe 401a, in which the liquid solvent 8 flows from the inside to the outside in the radial direction, are connected in series. The two spiral pipes 401a are stored in a common housing 411. The housing 411 is constituted by a thin plate made of aluminum and provided to be in contact with one surface of the rectangular cylindrical tank heating unit 34 provided in the solvent container 31. Accordingly, the preheating unit 41 may use the tank heating unit 34 to hat the liquid solvent 8 in the spiral pipes 401.

Here, the capacity of the spiral pipes 401a stored in the housing 411 is an amount corresponding to a replenishment amount of the liquid solvent 8 in the solvent container 31, which has been reduced to a position of "HL OFF" (lower limit position), to a height position of "HL ON", but may be more than the amount. The liquid solvent 8 supplied at room temperature (e.g., 23° C.) is heated to about 53° C. by the preheating unit 41, and then, supplied to the subsequent heat exchanging unit 42. The preheating unit 41 corresponds to the preliminary temperature adjusting unit of the present exemplary embodiment.

The liquid solvent supply path 401 emanating from the preheating unit 41 is connected to the heat exchanging unit 42 disposed in the solvent container 31. The heat exchanging unit 42 constitutes a terminal end side of the liquid solvent supply path 401 and has a configuration obtained by winding a pipe member made of a low thermal conductivity material such as, for example, a fluororesin from the lower side to the upper side in a spiral shape. The spiral pipe 401b constituting the heat exchanging unit 42 is disposed in the inner space of the solvent container 31 formed in a cylindrical shape, and arranged such that a spiral axis directs vertically over a region from a position in the vicinity of the lower end portion of the inner space to a height position of about two thirds of the height of the inner space.

The upper end of the spiral pipe 401b is opened towards the space in the solvent container 31, and the liquid solvent 8 flowing through the preheating unit 41 (spiral pipe 401a) and the heat exchanging unit 42 (spiral pipe 401b) flows down into the solvent container 31 through the opening. Here, the "HL ON" position which has been set in the liquid level meter 38 is set to a position in the vicinity of the lower side of the opening of the spiral pipe 401b. Further, the liquid-phase temperature detecting unit 37a is disposed at a position for detecting the temperature of the liquid-phase portion in the vicinity of the lower portion side of the inside of the heat exchanging unit 42. Meanwhile, the vapor-phase temperature detecting unit 37b is disposed at a position for detecting the temperature of the vapor-phase portion above the "HH" position set at the upper side of the heat exchanging unit 42.

The capacity of the spiral pipe 401b is an amount corresponding to a replenishment amount of the liquid solvent 8 in the solvent container 31, which has been reduced to a position of "HL OFF", to a height position of "HL ON", but is adjusted to a capacity substantially equal to that of the spiral pipe 401a, which is more than the replenishment amount.

In the above-mentioned state, when the solvent container 31 including the heat exchanging unit 42 disposed therein is filled with the liquid solvent 8 and then replenished with the liquid solvent 8 such that the height position of the liquid level fluctuates between the positions "HL ON" to "HL OFF", the lower part of the heat exchanging unit 42 is always immersed in the liquid-phase portion. As a result, the liquid solvent 8, which is preheated by the preheating unit 41 and then supplied to the spiral pipe 401*b* of the heat exchanging unit 42, is heated by the liquid solvent 8 of the liquid-phase portion through the pipe walls of the spiral pipe 401*b*.

Further, as illustrated in FIG. 2, the heat exchanging unit 42 has a gap formed between the pipe walls of the spiral pipe 401*b* so as to facilitate the flow of the liquid solvent 8 in the solvent container 31.

As illustrated in FIGS. 1 and 2, each unit provided in the solvent vapor generating apparatus 3, the smoothing processing apparatus 1, or the supply system of the solvent vapor, is connected to a control unit 6. The control unit 6 is constituted by a computer including a CPU and a storage unit (not illustrated), and the storage unit stores a program including a step (instruction) group organized for the operations of the solvent vapor generating apparatus 3 or the smoothing processing apparatus 1. The program is stored in a storage medium such as, for example, a hard disc, a compact disc, a compact disc, a magnet optical disc, or a memory card, and installed therefrom to the computer.

Figure 5:
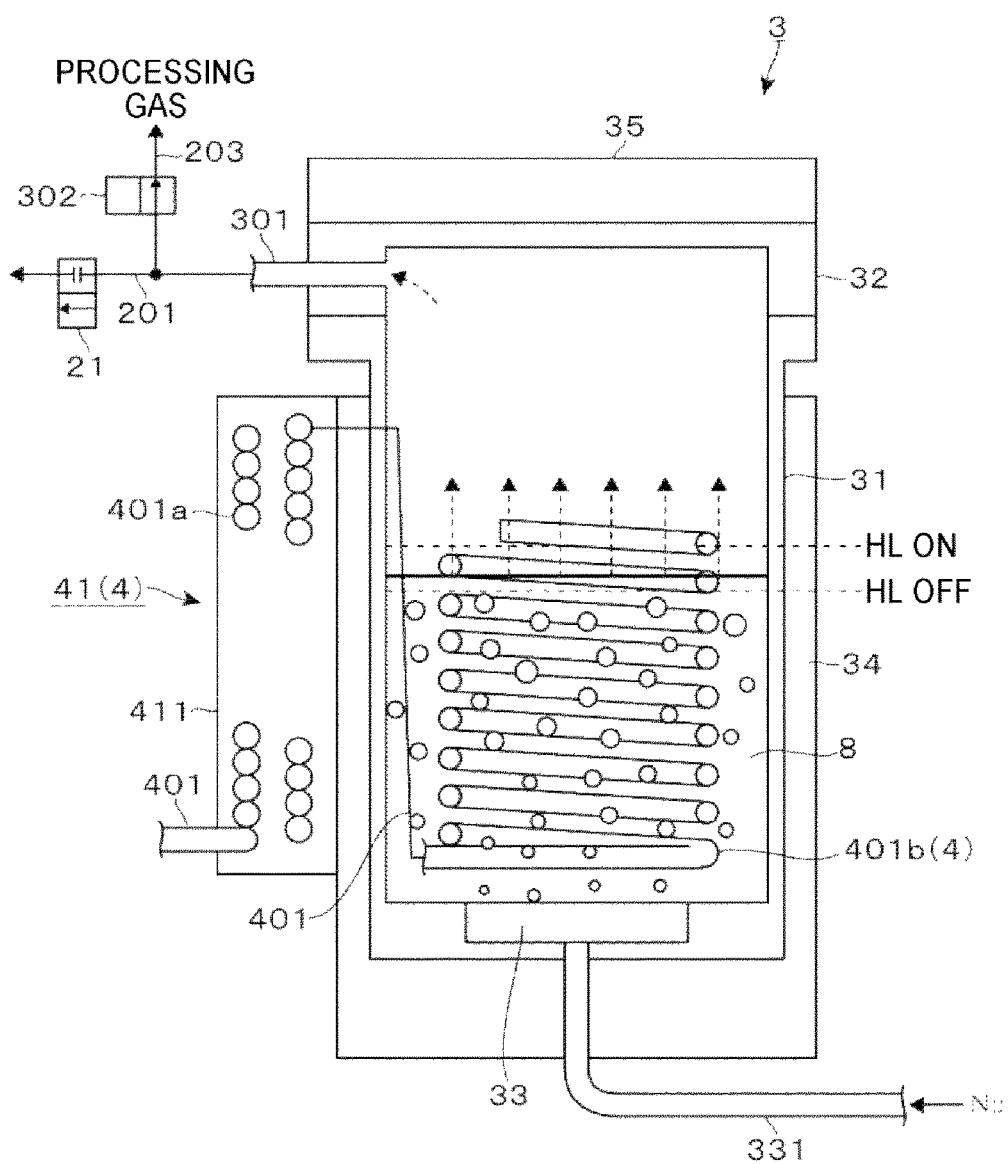
FIG. 5 is an explanatory view illustrating an action of vaporizing a solvent vapor by the solvent vapor generating apparatus.

Hereinafter, the actions of the solvent vapor generating apparatus 3 will be described with reference to FIGS. 5 to 9. FIG. 5 is an explanatory view illustrating an action of generating the solvent vapor by the solvent vapor generating apparatus 3. FIGS. 6 to 9 are explanatory views illustrating an action of replenishing the solvent container 31 with the liquid solvent 8. Further, in FIGS. 5 to 9, descriptions of the liquid-phase temperature detecting unit 37*a*, vapor-phase temperature detecting unit 37*b*, liquid level meter 38, and the heat radiating unit 36 are properly omitted, and the shape of the solvent vapor extraction path 301 is simplified.

First, an action of generating the solvent vapor will be described. At the timing of performing the smoothing processing on the wafer W by the smoothing processing apparatus 1, the solvent vapor is generated by bubbling the liquid solvent 8 in the solvent container 31 with a carrier gas from the bubbling nozzle 33. The generation of the solvent vapor is performed at the height position of the liquid level of the liquid solvent 8 in the liquid-phase portion within the set position ranging "HL ON" to "HL OFF".

When the carrier gas used for bubbling is in contact with the liquid solvent 8, the liquid solvent 8 is evaporated in bubbles of the carrier gas so that solvent vapor containing the carrier gas and solvent components may be obtained. The solvent vapor is taken out from the solvent container 31 through the solvent vapor extraction path 301 formed in the cover 32 and supplied to the smoothing processing apparatus 1 through the solvent vapor supply path 203.

Here, the inside of the solvent container 31 is heated from the side wall and the bottom wall of the solvent container 31 by the tank heating unit 34. However, as illustrated in Examples (FIG. 12) below, when a carrier gas at room temperature is supplied from the bubbling nozzle 33, the temperature of the vapor-phase portion having a small heat capacity is decreased rapidly. And, in the vapor-phase portion in contact with the liquid-phase portion (liquid solvent 8), when the temperature of the solvent vapor is decreased to the same temperature as that of the liquid solvent 8, a part of the solvent components is liquefied again.

As such, when the solvent components in the solvent vapor is liquefied, the concentration of the solvent vapor is changed by the solvent vapor generating apparatus 3 that is a source of the solvent vapor, even though the supply pipe of the solvent vapor supply path 203 is heated so as to suppress the dew condensation of the solvent vapor in the path. Therefore, it may be an obstacle to performing a uniform smoothing processing on each wafer W in the smoothing processing apparatus 1.

Accordingly, as described above, the tank heating unit 34 that heats the liquid-phase portion and the cover heating unit 35 that heats the vapor-phase portion are independently provided in the solvent vapor generating apparatus 3 of the present exemplary embodiment.

In the tank heating unit 34, the electric power supplied from the electric power supplying unit 342 is increased or decreased such that the temperature of the liquid-phase portion detected by the liquid-phase temperature detecting unit 37*a* reaches a target temperature (70° C.). Meanwhile, in the cover heating unit 35, the electric power supplied from the electric power supplying unit 352 is increased or decreased such that the temperature of the vapor-phase portion detected by the vapor-phase temperature detecting unit 37*b* reaches a target temperature (73° C.) which is higher than the temperature of the liquid-phase portion.

As a result, although a low-temperature carrier gas is supplied from the bubbling nozzle 33, the temperature of the vapor-phase portion is maintained at a temperature higher than that of the liquid-phase portion and re-liquefaction of the solvent components are suppressed, so that a stable concentration of the solvent vapor may be supplied to the smoothing processing apparatus 1. Further, the carrier gas supplied to the solvent vapor generating apparatus 3 is not limited to a case where the carrier gas is supplied at room temperature. For example, the carrier gas may be supplied, for example, in a state where it is preheated to a temperature closer to that of the liquid solvent 8 by a preheater. In this case, it is also possible to suppress re-liquefaction of the solvent due to the decrease of the temperature of the solvent vapor cause by affection of evaporation heat.

Next, descriptions will be made on a method of performing a replenishment of the liquid solvent 8 while performing a temperature adjustment using the solvent heating unit 4 (the preheating unit 41 and the heat exchanging unit 42).

An amount of the solvent vapor generated in the solvent vapor generating apparatus 3 may be changed due to the affection of the temperature change of the vapor-phase portion in the solvent vapor generating apparatus 3 as described above, as well as due to the temperature change of the liquid-phase portion.

For example, when the liquid solvent 8 (e.g., 23° C.) is supplied as it is to the solvent container 31 without providing the solvent heating unit 4, the temperature of the liquid-phase portion is decreased rapidly, and hence, the concentration of the solvent components in the solvent vapor is decreased. In order to avoid the concentration change, it is desirable to suppress the temperature change of the liquid solvent 8 in the solvent container 31 within ±1.0° C. during the replenishment period of the liquid solvent 8.

Meanwhile, when a separate heater or heat exchanger is provided to a pipe constituting the liquid solvent supply path 401, independently from the solvent vapor generating apparatus 3, not only an additional temperature adjusting mechanism is needed, but also a space for providing such a mechanism is needed. Therefore, the solvent vapor generating apparatus 3 of the present exemplary embodiment is configured to preheat the liquid solvent 8 using the tank heating unit 34 provided in the solvent container 31.

Figure 6:
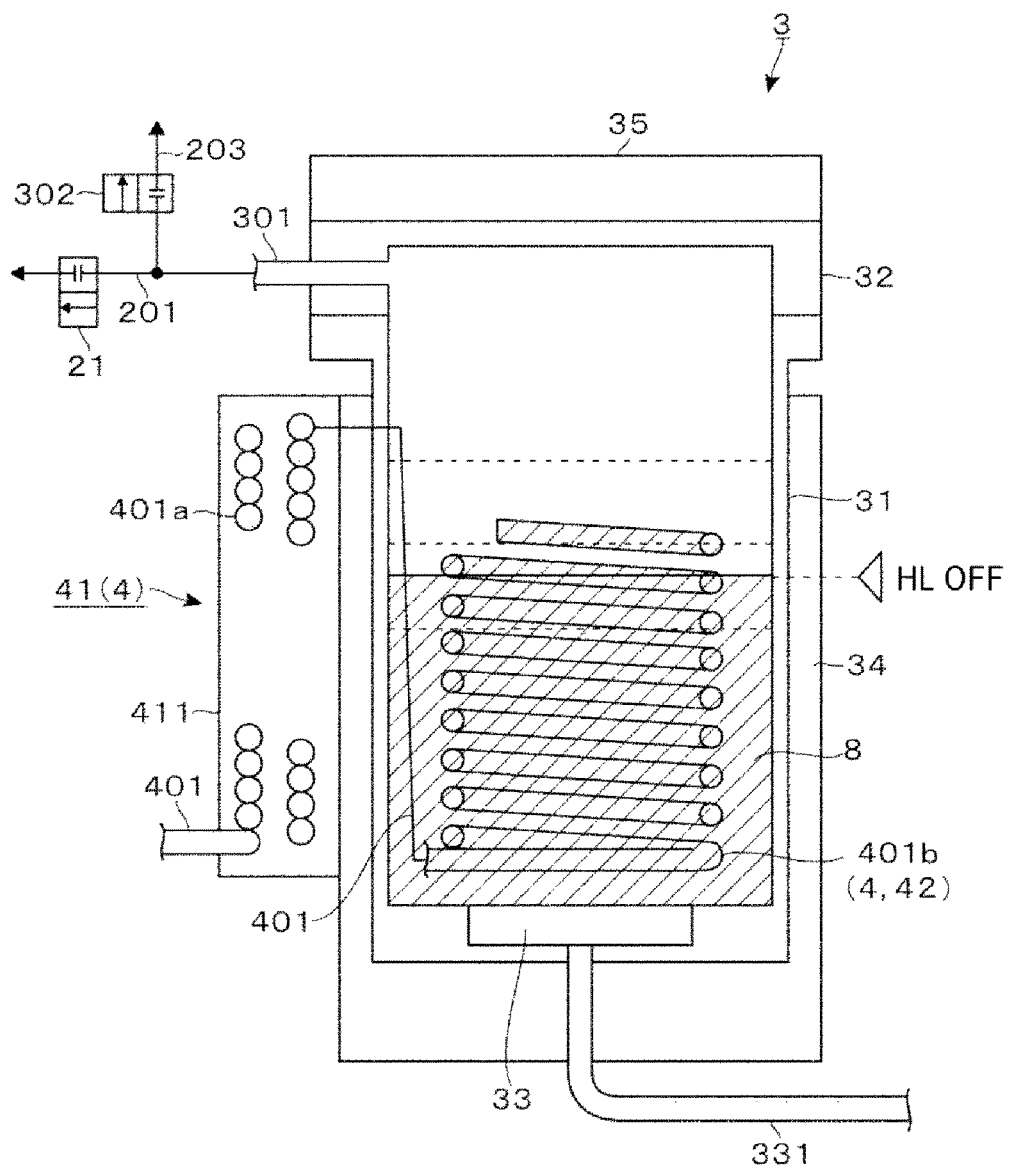
FIG. 6 is a first explanatory view illustrating an action of replenishing the solvent vapor generating apparatus with a liquid solvent.

For example, FIG. 6 illustrates a timing when the liquid solvent 8 replenished to the solvent container 31 up to the position of "HL ON" is consumed by the smoothing processing of the wafer W and reduced to the height position of "HL OFF". The liquid solvent 8 replenished to the position of "HL ON" is consumed to the position of "HL OFF" for a sufficiently long period of time for performing the temperature adjustment in the preheating unit 41 or the heat exchanging unit 42, for example, for several hours to about a day.

Hence, in a state before the replenishment of the liquid solvent 8 is started, the temperature of the liquid solvent 8 in the heat exchanging unit 42 (spiral pipe 401b) is substantially the same as that of the liquid-phase portion (as indicated by hatching slant upwardly to the right in FIG. 6). Further, the temperature of the liquid solvent 8 in the preheating unit 471 (spiral pipes 401a) heated in the housing 411 by receiving heat from the tank heating unit 34, is set to, for example, 53° C., which is a setting temperature for the outlet of the preheating unit 41 (as indicated by hatching of a dotted pattern in FIG. 6).

In this state, when the height of the liquid level of the liquid solvent 8 in the solvent container 31 reaches the position of "HL OFF" (FIG. 6), a predetermined amount of the liquid solvent 8 is supplied to the solvent vapor generating apparatus 3 by supplying a delivery gas to the solvent bottle 5. As a result, the liquid solvent 8 flows into the liquid-phase portion from the heat exchanging unit 42 (spiral pipe 401b) provided at the terminal end side of the liquid solvent supply path 401, but the temperature of the liquid solvent 8 in the heat exchanging unit 42 becomes substantially the same as that of the liquid solvent 8 in the solvent container 31. Therefore, the temperature of the liquid-phase portion is hardly changed by the inflow (FIG. 7).

Figure 7:
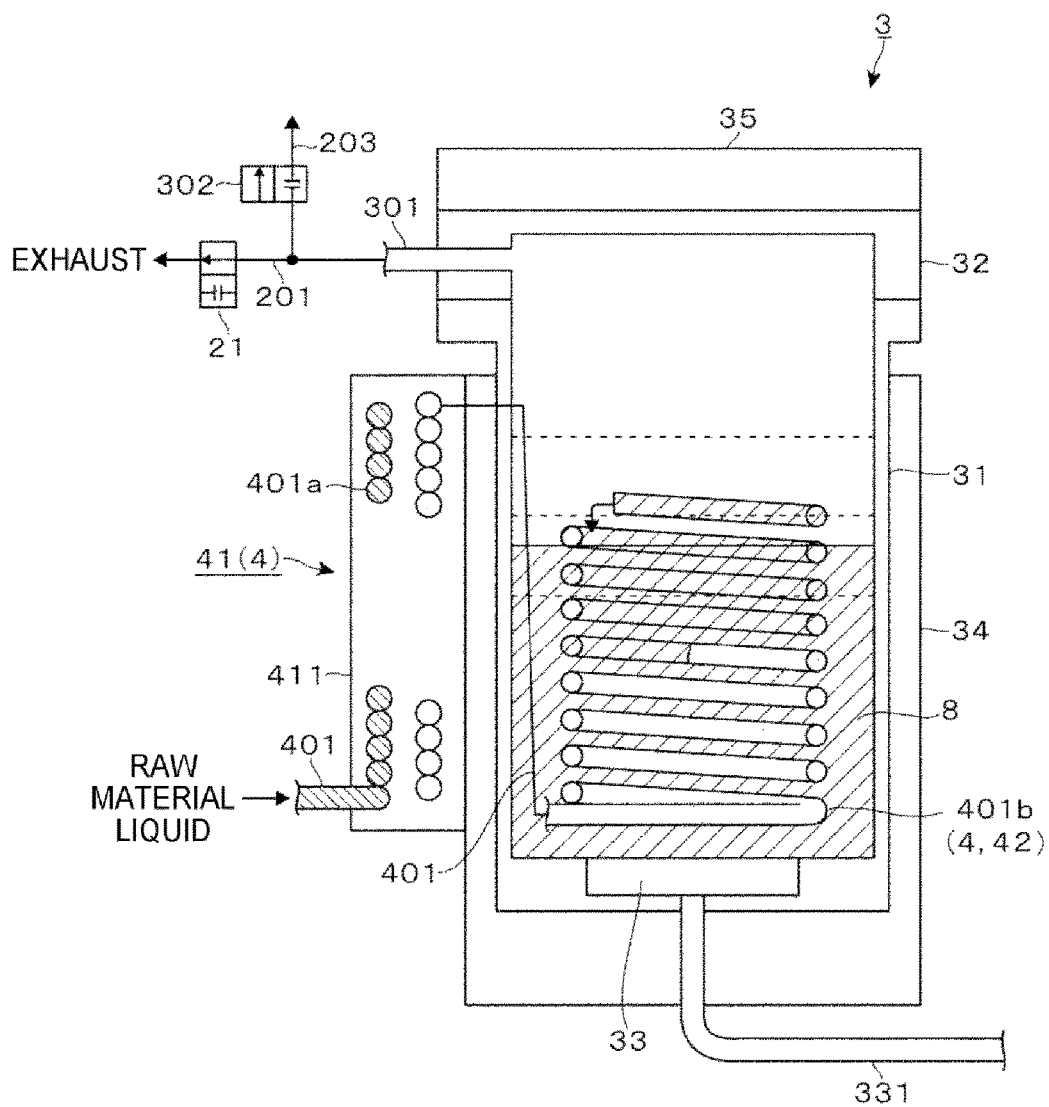
FIG. 7 is a second explanatory view illustrating an action of replenishing the solvent vapor generating apparatus with the liquid solvent.

As illustrated in FIG. 7, a new liquid solvent 8 is supplied to the upstream side of the spiral pipe 401b (as indicated by hatching of a dotted pattern). Since the liquid solvent 8 is preheated by the preheating unit 41, the temperature difference between the inner side and outer side of the spiral pipe 401b is small, as compared with a case where the liquid solvent 8 supplied from the solvent bottle 5 is directly supplied. Further, since the spiral pipe 401b is made of a resin having a lower heat conductivity compared with a metal, the migration of heat from the liquid-phase portion to the liquid solvent 8 in the spiral pipe 401b proceeds slowly. From this viewpoint, the change width of the temperature of the liquid-phase portion due to the supply of the liquid solvent 8 at a lower temperature than that of the liquid-phase portion to the heat exchanging unit 42, is suppressed small.

The liquid solvent 8 at room temperature supplied from the solvent bottle 5 (as indicated by hatching slant downwardly to the right in FIG. 7) enters the preheating unit 41 provided outside the solvent container 31 and does not come into contact with the liquid-phase portion in the solvent container 31. Therefore, the change of the temperature of the liquid-phase portion is suppressed by this structure.

Figure 8:
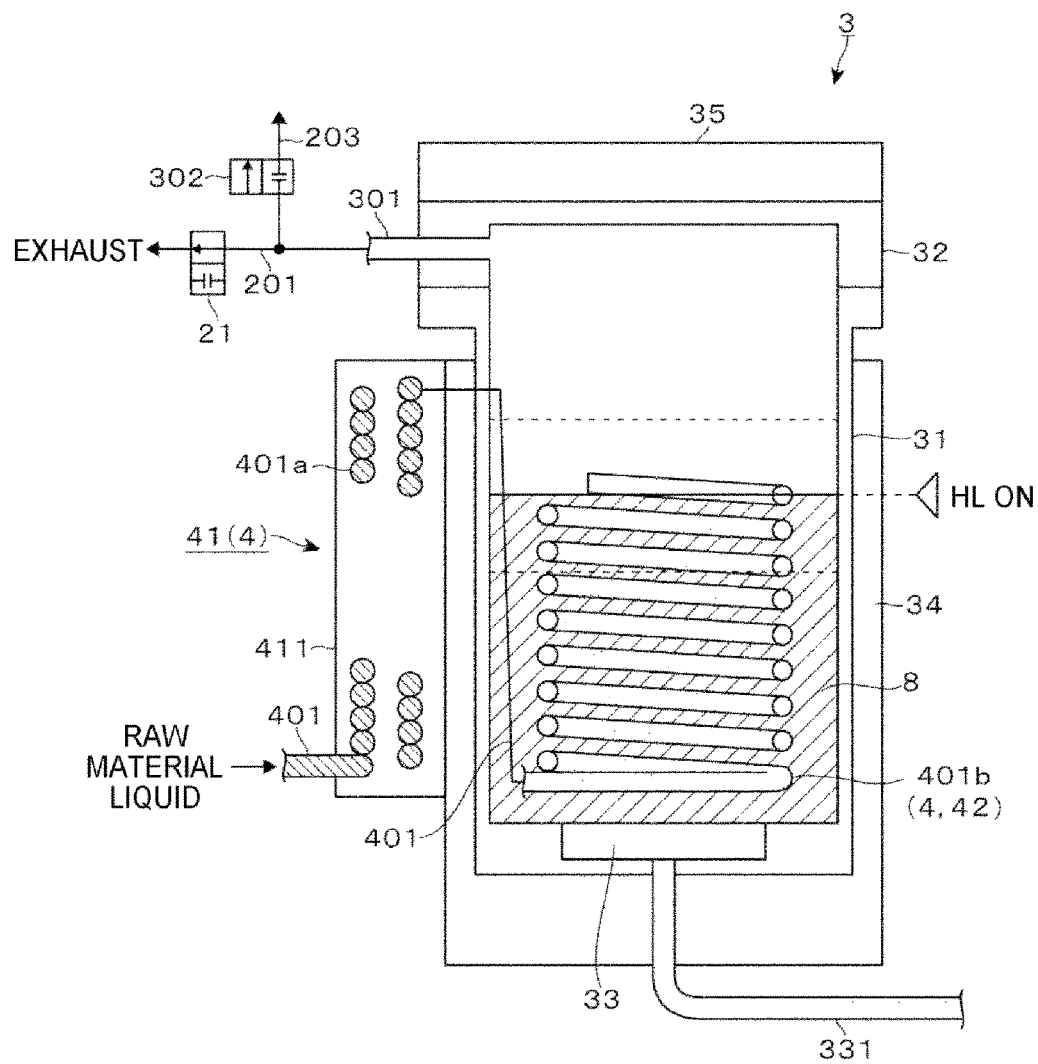
FIG. 8 is a third explanatory view illustrating an action of replenishing the solvent vapor generating apparatus with the liquid solvent.
Figure 9:
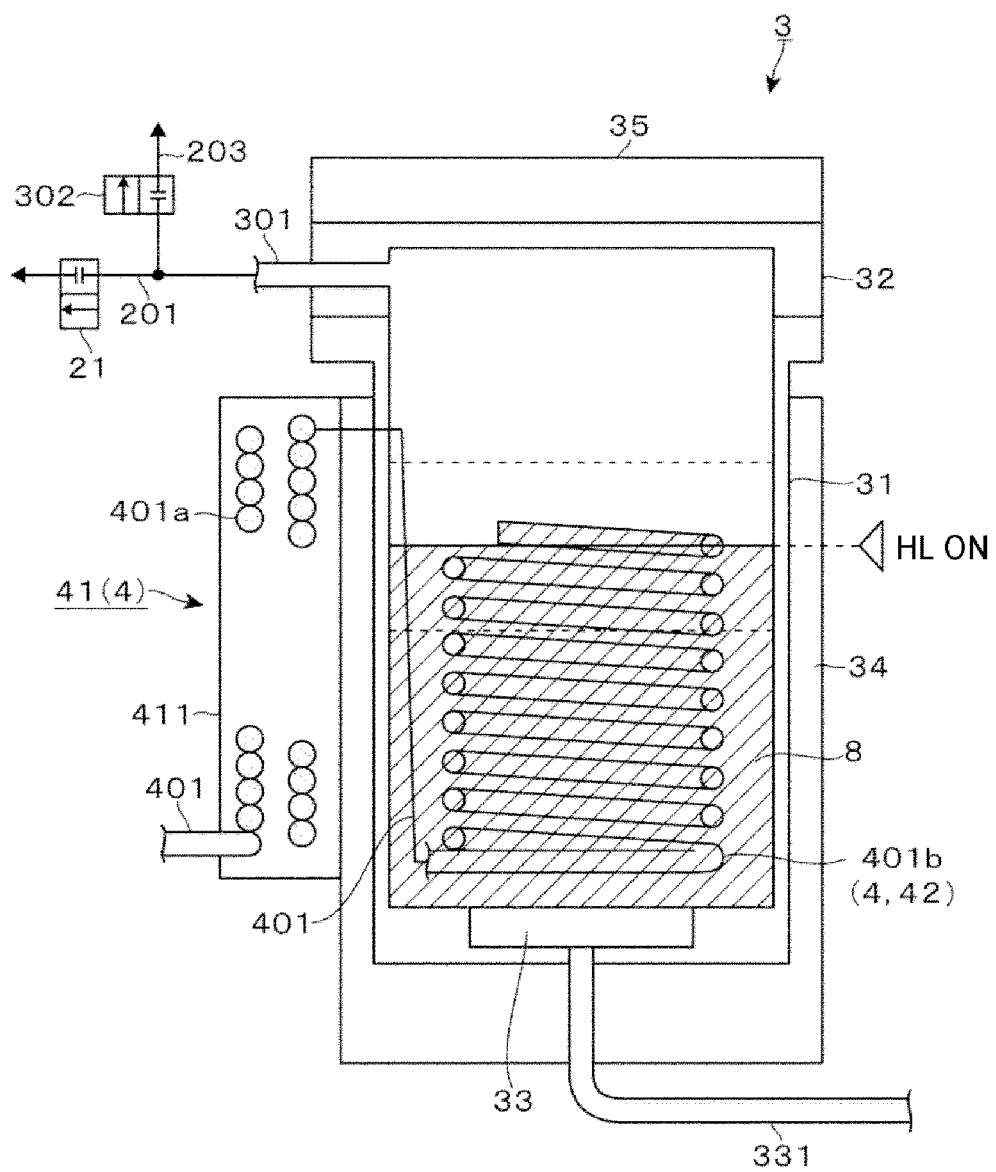
FIG. 9 is a fourth explanatory view illustrating an action of replenishing the solvent vapor generating apparatus with the liquid solvent.

Thus, since the liquid solvent 8 in the preheating unit 41 is extruded to the heat exchanging unit 42 by supplying a new liquid solvent 8 to the preheating unit 41 and also the liquid solvent 8 in the heat exchanging unit 42 is allowed to flow down into the solvent container 31, the liquid solvent 8 may be replenished up to the position of "HL ON" while suppressing the change of temperature of the liquid-phase portion (see FIG. 8). In addition, when the delivery of the liquid solvent 8 from the solvent bottle 5 is stopped at a timing when a predetermined amount of the liquid solvent 8 is replenished, the liquid solvent 8 in the heat exchanging unit 42 (spiral pipe 401b) is heated by the heat supplied from the liquid-phase portion so that both the liquid solvents 8 are at substantially the same temperature (FIG. 9). Further, the liquid solvent 8 in the preheating unit 41 (spiral pipes 401a) is heated by the heat supplied from the tank heating unit 34 (FIG. 9).

By replenishing the solvent container 31 with the liquid solvent 8 while suppressing the temperature change as described above, the concentration change of the solvent components contained in the liquid vapor may be suppressed small, even though the solvent vapor has been generated by bubbling with the carrier gas, for example, during the replenishment period of the liquid solvent 8.

Here, in a case where the timing of replenishing the solvent container 31 comparted from the outside with the liquid solvent 8 is during the period of generating the solvent vapor, a pressure increase in the solvent container 31 is suppressed by supplying the generated solvent vapor towards the smoothing processing apparatus 1. Meanwhile, in a case where the replenishment of the liquid solvent 8 is performed during the period when no solvent vapor is generated, the gas in the solvent container 31 is exhausted to the outside by opening the opening/closing valve 21 of the exhaust path 201, as illustrated in FIGS. 7 and 8.

The solvent vapor generating apparatus 3 according to the present exemplary embodiment has the following effects. When taking out the solvent vapor generated by bubbling the liquid solvent 8 stored in the solvent container 31 with a carrier gas, the temperature adjustment is performed such that the temperature of the vapor-phase portion is higher than the temperature of the liquid-phase portion. Therefore, re-liquefaction of the solvent due to temperature decrease of the solvent vapor may be suppressed, and hence, a stable amount of the solvent vapor may be supplied to the wafer W.

In the solvent vapor generating apparatus 3 as illustrated in FIG. 2, descriptions were made on the case where the supplying electric power supplied to the tank heating unit 34 and the cover heating unit 35 from the electric power supplying units 342, 352 is increased or decreased based on the temperature of the liquid solvent 8 or the temperature of the solvent vapor detected by the liquid-phase temperature detecting unit 37a and the vapor-phase temperature detecting unit 37b. However, such a feedback mechanism is not necessarily provided. For example, at a timing when the temperature of the solvent vapor in the solvent container 31 at a setting step of the solvent vapor generating apparatus 3, the temperature of the solvent vapor may be grasped by, for example, an experiment, and then, the output of the cover 32 or the cover heating unit 35 may be set to a fixed value such that the temperature of the solvent vapor does not fall down below the temperature of the liquid solvent 8 at that timing.

Further, both the preheating unit 41 and the heat exchanging unit 42 are not necessarily provided in the solvent heating unit 4, but any one may be provided depending on an allowable width of the temperature change of the liquid-phase portion.

Further, it is not limited to the case where a liquid solvent colder than the liquid solvent 8 in the solvent container 31 is supplied from the solvent bottle 5. In this case, a water cooler, for example, may be provided in place of the preheating unit 41 so that the liquid solvent 8 flowing through the heat exchanging unit 42 is cooled by the liquid solvent 8 in the solvent container 31.

Figure 10:
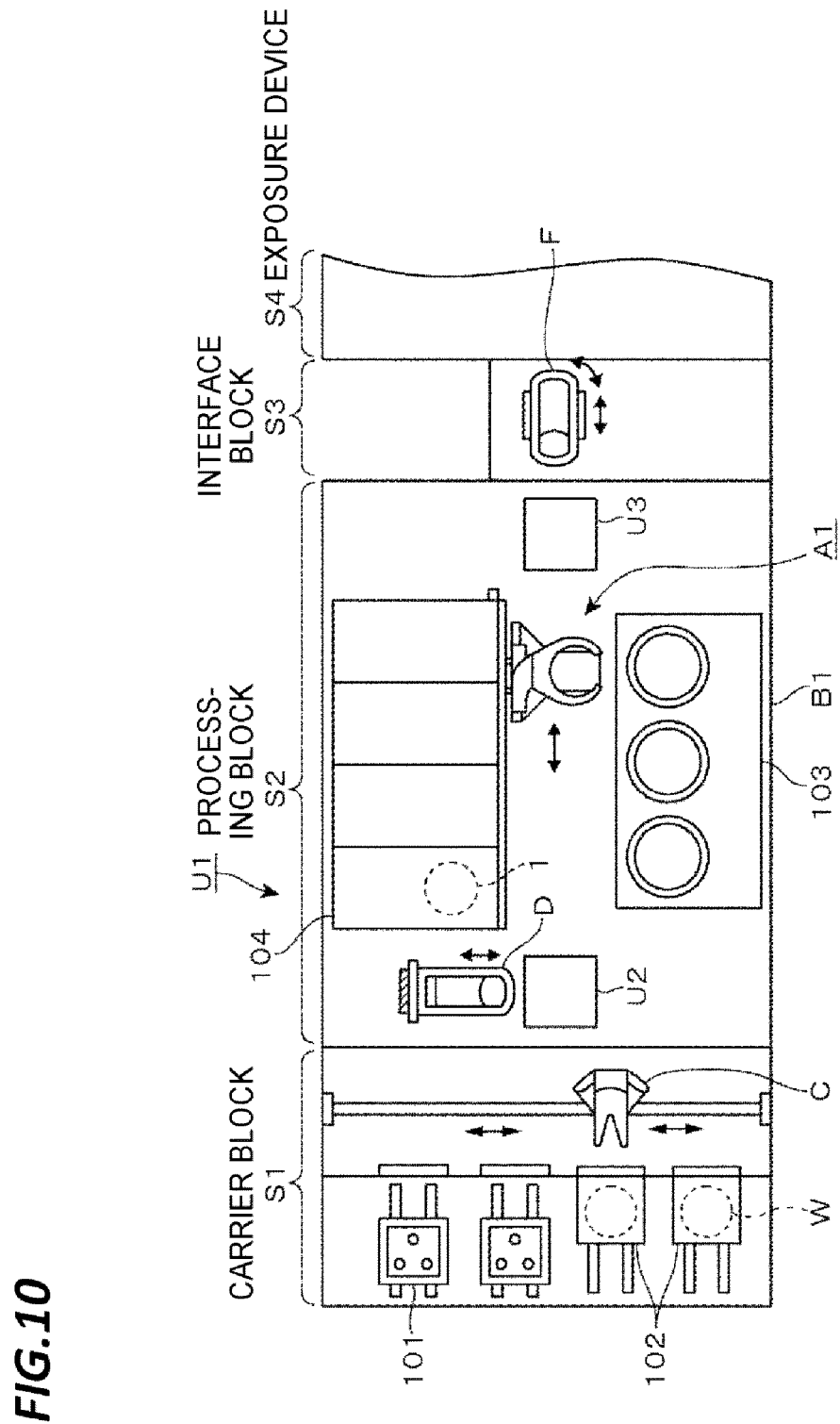
FIG. 10 is a plan view illustrating an exemplary coating and developing apparatus including a supply system of the solvent vapor.
Figure 11:
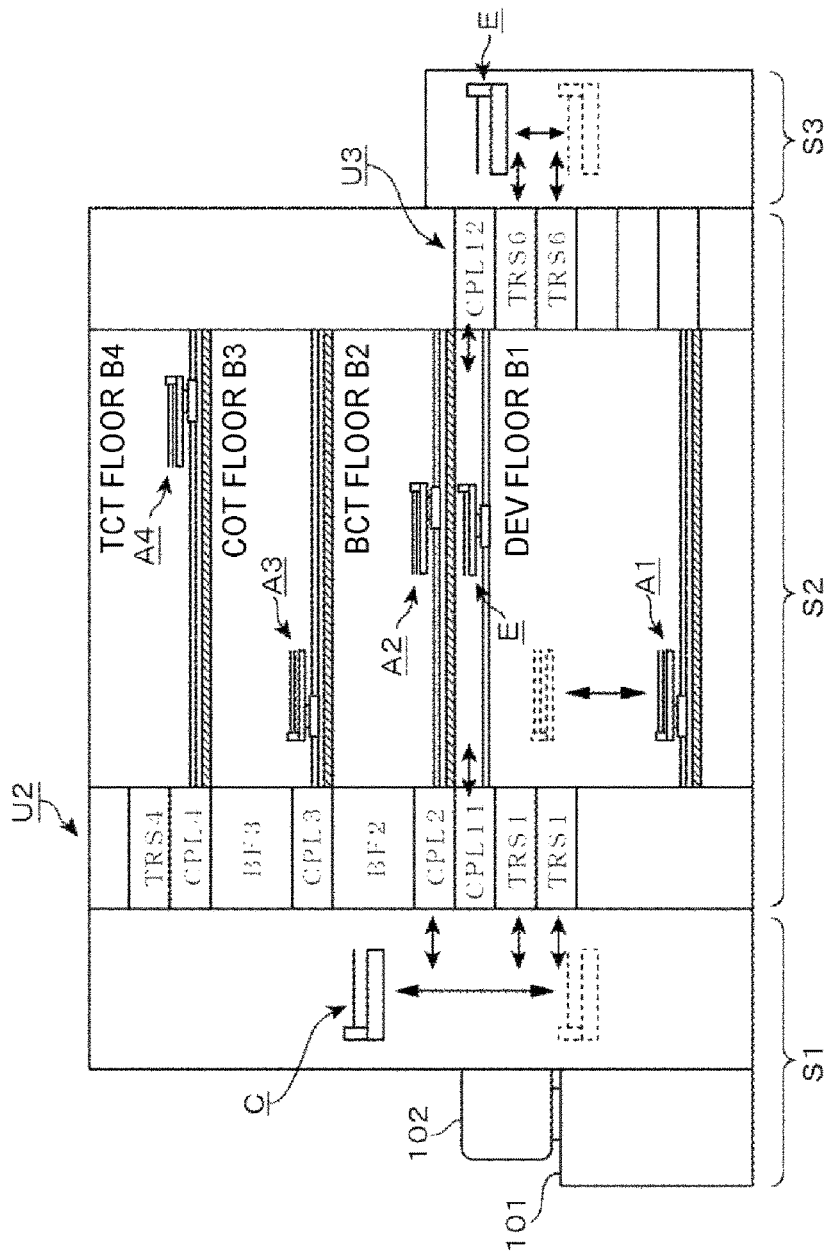
FIG. 11 is a vertical cross-sectional view illustrating the coating and developing apparatus.

Subsequently, an exemplary configuration of a coating and developing apparatus including the above-mentioned smoothing processing apparatus 1 will be briefly described with reference to FIGS. 10 and 11.

When a carrier 102 accommodating wafers W to be processed is placed on a placing table 101 provided in a carrier block 51 of the coating and developing apparatus, the wafers W are taken out by a delivery arm C. The taken wafers W are delivered to a delivery module CPL2 in a shelf unit U2 provided in a processing block S2 and carried into a BCT floor B2 by a conveyance arm A2, so that an antireflective film is formed thereon. Then, the wafers W are delivered to a delivery module BF2 of a shelf unit U1 and carried into a COT floor B3 through a delivery module CPL3 and a conveyance arm A3, so that a resist film is formed thereon.

The wafers W including the resist film formed thereon are delivered to a delivery module BF3 of the shelf unit U1 by the conveyance arm A3, and then, delivered to a conveyance arm A4, for example, through the delivery module BF3→a delivery arm D→a delivery module CPL4, so that an antireflective film is formed on the resist film in a TCT floor B4. Thereafter, the wafers W are delivered to a delivery module TRS4 by a conveyance arm A4. Meanwhile, the antireflective film may not be formed on the resist film, or the wafers W may be subjected to a hydrophobic treatment instead of forming the antireflective film under the resist film.

The wafers W including the antireflective film formed thereon, which have been delivered to the delivery module TRS4, are delivered to a delivery module CPL11 and conveyed to a delivery module CPL12 of a shelf unit U3 by a shuttle arm E for conveyance only provided on the top of a DEV floor B1. Subsequently, the wafers W are taken into an interface block S3, and conveyed to an exposure device S4 by an interface arm F, in which a predetermined exposure processing is performed. Thereafter, the wafers W are placed on a delivery module TRS6 of the shelf unit U3 and returned to the processing block S2.

The wafers W returned to the processing block S2 are subjected to a development processing in the DEV floor B1, and then, conveyed to a substrate processing unit 104 provided with the smoothing processing apparatus 1 of the present exemplary embodiment, in which a smoothing processing is performed. Subsequently, in the DEV floor B1, the wafers W are conveyed to a heating module provided in the processing module group U1 and heated to a predetermined temperature, for example, 100° C. so that a solvent remaining on a resist pattern is removed. Thereafter, the wafers W are conveyed, for example, to a cooling module provided in the processing module U1 by a conveyance arm A1 and cooled to a predetermined temperature, for example, 23° C. Then, the wafers W are conveyed to a delivery table in an access range of the delivery arm C in the shelf unit U2 and returned to the carrier 102 through the delivery arm C.

Here, an apparatus which may apply the solvent vapor generating apparatus 3 according to the present exemplary embodiment as illustrated in FIG. 2 is not limited to the smoothing processing apparatus 1 for performing the smoothing processing of the wafers W. The present disclosure may be applied to, for example, various processing gas generating apparatuses in a hydrophobic treatment apparatus for hydrophobizing a surface of a wafer W by supplying a gas for hydrophobic treatment such as, for example, hexamethyl disilazane (HMDS), to the wafer W, a film forming apparatus for forming a film on a surface of a wafer W by chemical vapor deposition (CVD) using a gas for film formation, or a cleaning apparatus in which a cleaning processing is performed by immersing a wafer W in a processing bath filled with a processing liquid, and then, a drying processing is performed by pulling the wafer W into an atmosphere of a vapor of an organic solvent such as isopropyl alcohol (IPA) serving as a processing gas for drying.

EXAMPLES

Test Example 1

Temporal changes of temperatures of a liquid-phase portion and a vapor-phase portion in a solvent container 31 were investigated when a solvent vapor was generated by a solvent vapor generating apparatus 3 including a tank heating unit 34 that heats the solvent container 31 and a cover heating unit 35 that heats a cover 32.

A. Test Conditions

To a solvent container 31 having an internal capacity of 200 milliliters, 100 milliliters of NMP was added, and operations including supplying and stopping the supply of nitrogen gas of 23° C. as a carrier gas from a bubbling nozzle 33 were repeated to generate solvent vapor. The target temperature of a liquid-phase portion heated by the tank heating unit 34 was set to 70° C., and the target temperature of a vapor-phase portion heated by the cover heating unit 35 was set to 73° C.

B. Test Results

Figure 12:
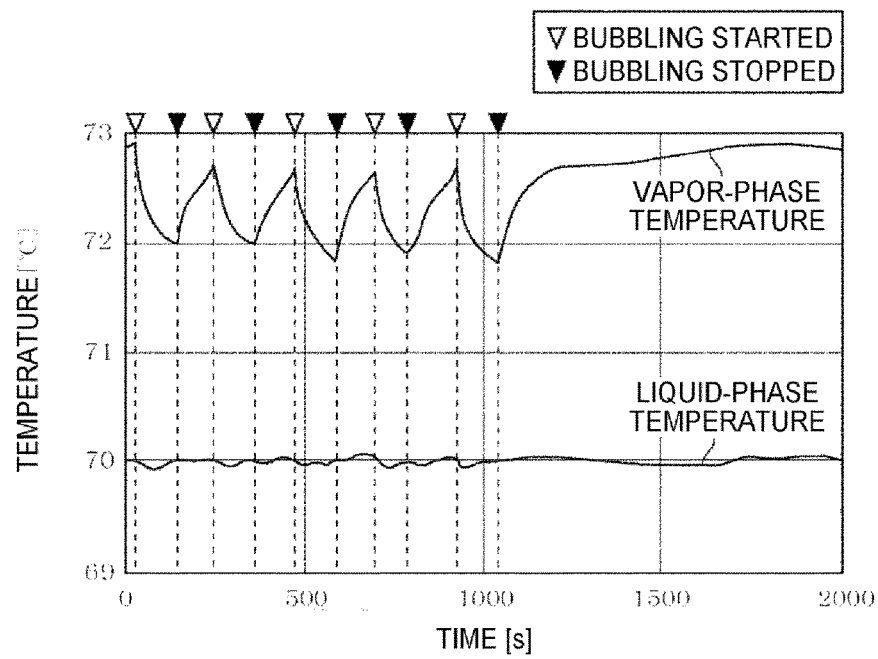
FIG. 12 is an explanatory view illustrating temporal changes of a liquid-phase temperature and a vapor-phase temperature in the action of vaporizing the solvent vapor by the solvent vapor generating apparatus.

The temporal changes of the temperature of the liquid-phase portion (liquid-phase temperature) and the temperature of the vapor-phase portion (vapor-phase temperature) in the solvent container 31 are illustrated in FIG. 12. In FIG. 12, the horizontal axis represents time, and the vertical axis represents liquid-phase temperature or vapor-phase temperature. Further, the timing of starting bubbling is indicated by a broken line with inverted white triangles, and the timing of stopping bubbling is indicated by a broken line with inverted black triangles.

As illustrated in FIG. 12, even though the carrier gas for bubbling was supplied, the liquid-phase temperature was substantially not changed in the liquid solvent 8 having high heat conductivity. Meanwhile, the vapor-phase temperature was rapidly decreased by about 1.0° C. at the timing of supplying the carrier gas for bubbling. However, in the present test example in which the cover heating unit 35 for heating the solvent vapor side only was provided, a phenomenon that the vapor-phase temperature (the temperature of the solvent vapor) is decreased to the liquid-phase temperature (the temperature of the liquid solvent 8), was not confirmed. Further, it was confirmed that when the bubbling is stopped, the vapor-phase temperature is rapidly increased almost to the target temperature of the vapor-phase portion.

Test Example 2

The liquid solvent 8 was replenished by the solvent vapor generating apparatus 3 including a preheating unit 41 and a heat exchanging unit 42 as illustrated in FIG. 2, and a temporal change of the liquid-phase temperature was investigated.

A. Test Conditions

A solvent container 31 having an internal capacity of 200 milliliters accommodated 100 milliliters of NMP and NMP of 55° C. was supplied thereto from the outside. The target temperature of the tank heating unit 34 was set to 60° C. At this time, the outlet temperature of the preheating unit 41 was 58° C.

B. Test Results

Figure 13:
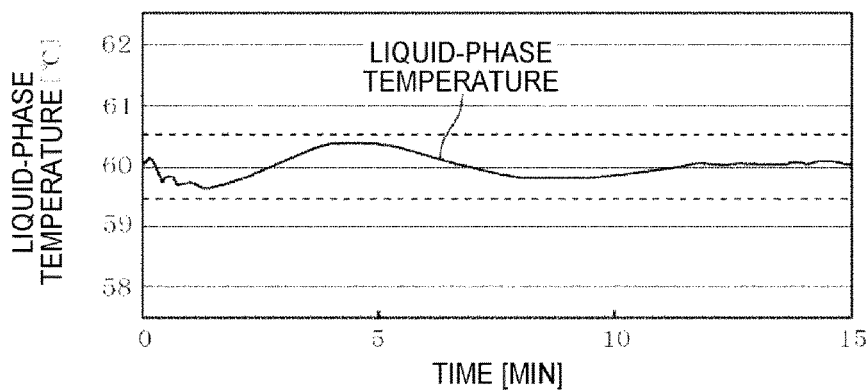
FIG. 13 is an explanatory view illustrating a temporal change of the liquid-phase temperature in the action of replenishing the solvent vapor generating apparatus with the liquid solvent.

The temporal change of the liquid-phase temperature in the solvent container 31 is illustrated in FIG. 13. In FIG. 13, the horizontal axis represents time, and the vertical axis represents liquid-phase temperature. In FIG. 13, the time when the replenishment with the liquid solvent 8 was performed was denoted as zero.

As illustrated in FIG. 13, when the replenishment with the liquid solvent 8 was performed, the liquid-phase temperature was changed, but the change width could be suppressed within a range of ±0.5° C. In a preliminary experiment (not illustrated) in which a solvent container 31, which is not provided with the preheating unit 41 and the heat exchanging unit 42, was replenished with NMP the temperature of which is 1° C. lower than the target temperature in the same amount as in the present exemplary embodiment, the change width of the liquid-phase temperature exceeded a range of ±0.5° C. Therefore, it is understood that a proper temperature adjustment may be performed by providing the preheating unit 41 and the heat exchanging unit 42.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An apparatus for generating a processing gas by bubbling a raw material liquid with a carrier gas, the apparatus comprising:
    a raw material liquid tank configured to store the raw material liquid;
    a raw material liquid supplying path provided between a raw material liquid bottle that stores the raw material liquid and the raw material liquid tank and configured to supply the raw material liquid into the raw material liquid tank from the raw material liquid bottle,
    a cover provided at a top portion of the raw material liquid tank and configured to block an opening formed on a top surface of the raw material liquid tank;
    a carrier gas source connected to the raw material liquid tank through a carrier gas supply path and configured to supply the carrier gas to the raw material liquid in the raw material liquid tank;
    a taking-out path provided inside the cover and configured to take out the processing gas generated by the bubbling from a vapor-phase portion above a liquid-phase portion which is a region where the raw material liquid is stored in the raw material liquid tank, an end of the taking-out path being connected to the vapor-phase portion and the other end of the taking-out path being connected to a processing gas supply path to supply the processing gas to a substrate provided outside of the apparatus for generating the processing gas through the processing gas supply path;
    a first temperature controller having a square column shape to cover a side wall and a bottom wall of the raw material liquid tank and configured to perform a temperature adjustment of the liquid-phase portion through at least one of the side wall and the bottom wall of the raw material liquid tank; and
    a second temperature controller having a plate shape to cover an upper surface of the cover and configured to perform a temperature adjustment of the vapor-phase portion through the upper surface of the cover such that a temperature of the vapor-phase portion is higher than a temperature of the liquid-phase portion,
    wherein the raw material liquid supplying path includes a raw material liquid temperature controller provided from an outside of a sidewall surface of the first temperature controller to an inside of the raw material liquid tank and configured to adjust a temperature of the raw material liquid such that the temperature of the raw material liquid supplied to the raw material liquid tank approaches the temperature of the liquid-phase portion.

2. The apparatus of claim 1, wherein the raw material liquid temperature controller includes a preliminary temperature controller provided on the sidewall surface of the first temperature controller and provided with a spiral pipe formed by winding a portion of the raw material liquid supplying path in a spiral shape such that an outer peripheral surface and an inner peripheral surface of the spiral pipe arranged an inside and an outside in a radial direction are in contact with each other to transfer heat through the outer peripheral surface and the inner peripheral surface of the spiral pipe, and
    the preliminary temperature controller is configured to cause the temperature of the raw material liquid to approach the temperature of the liquid-phase portion at an outside of the raw material liquid tank.

3. The apparatus of claim 2, wherein the raw material liquid supplying path includes a supply pipe through which the raw material liquid is supplied to the raw material tank, and
    the preliminary temperature controller is configured to cause the temperature of the raw material liquid flowing through the supply pipe to approach the temperature of the liquid-phase portion, using the first temperature controller.

4. The apparatus of claim 2, wherein the raw material liquid supplying path includes a supply pipe through which the raw material liquid is supplied to the raw material liquid tank from the raw material liquid bottle, and
    the raw material liquid temperature controller further includes a heat exchanging unit provided inside of the raw material liquid tank and constituted by a terminal end side of the supply pipe disposed to be immersed in the raw material liquid of the liquid-phase portion, and configured to perform a heat exchange between the raw material liquid in the supply pipe and the liquid-phase portion such that the temperature of the raw material liquid supplied to the raw material liquid tank approaches the temperature of the liquid-phase portion.

5. The apparatus of claim 4, wherein the terminal end side of the supply pipe constituting the heat exchanging unit is formed in a spiral shape extending vertically in the raw material liquid tank.

6. The apparatus of claim 4, wherein the terminal end side of the supply pipe constituting the heat exchanging unit is made of a resin.

7. The apparatus of claim 1, further comprising:
    a liquid-phase temperature detector inserted into the cover toward an inside of the raw material liquid tank through the opening of the raw material liquid tank and configured to detect the temperature of the liquid-phase portion; and
    a vapor-phase temperature detector inserted into the cover toward the inside of the raw material liquid tank through the opening of the raw material liquid tank and configured to detect the temperature of the vapor-phase portion,
    wherein the first temperature controller is configured to perform the temperature adjustment of the liquid-phase portion such that a detection temperature of the liquid-phase temperature detector becomes a first temperature serving as a temperature set value of the liquid-phase portion, and the second temperature controller is configured to perform the temperature adjustment of the vapor-phase portion such that a detection temperature of the vapor-phase temperature detector becomes a second temperature serving as a temperature set value of the vapor-phase portion.

8. The apparatus of claim 1, further comprising:
a liquid level meter configured to detect a height position of a liquid level of the liquid-phase portion,
wherein, when the height position of the liquid level detected by the liquid level meter reaches a preset lower limit, the raw material liquid supplying path is configured to supply the raw material liquid to the raw material liquid tank.

9. An apparatus for generating a processing gas by bubbling a raw material liquid with a carrier gas, the apparatus comprising:
a raw material liquid tank configured to store the raw material liquid;
a cover provided at a top portion of the raw material liquid tank and configured to block an opening formed on a top surface of the raw material liquid tank;
a carrier gas source connected to the raw material liquid tank through a carrier gas supply path and configured to supply the carrier gas to the raw material liquid in the raw material liquid tank;
a taking-out path provided inside the cover and configured to take out a processing gas generated by the bubbling from a vapor-phase portion above a liquid-phase portion which is a region where the raw material liquid is stored in the raw material liquid tank, an end of the taking-out path being connected to the vapor-phase portion and the other end of the taking-out path being connected to a processing gas supply path to supply the processing gas to a substrate provided outside of the apparatus for generating the processing gas through the processing gas supply path;
a raw material liquid supplying path including a supply pipe through which the raw material liquid is supplied to the raw material liquid tank from a raw material liquid bottle that stores the raw material liquid and provided between the raw material liquid bottle and the raw material liquid tank;
a first temperature controller having a square column shape to cover a side wall and a bottom wall of the raw material liquid tank and configured to perform a temperature adjustment of the liquid-phase portion through at least one of the side wall and the bottom wall of the raw material liquid tank;
a second temperature controller having a plate shape to cover an upper surface of the cover and configured to perform a temperature adjustment of the vapor-phase portion through the upper surface of the cover such that a temperature of the vapor-phase portion is higher than a temperature of the liquid-phase portion; and
wherein the raw material liquid supplying path includes a raw material liquid temperature controller provided from an outside of a sidewall surface of the first temperature controller to an inside of the raw material liquid tank and configured to adjust a temperature of the raw material liquid such that the temperature of the raw material liquid supplied to the raw material liquid tank approaches the temperature of the liquid-phase portion, and
the raw material liquid temperature controller of the raw material liquid supplying path includes a heat exchanging unit provided inside of the raw material liquid tank and constituted by a terminal end side of the supply pipe disposed to be immersed in the raw material liquid of the liquid-phase portion and configured to perform a heat exchange between the raw material liquid in the supply pipe and the liquid-phase portion.

10. A method of generating a processing gas for processing a substrate, the method comprising:
providing an apparatus for generating the processing gas for processing the substrate, the apparatus comprising:
a raw material liquid tank configured to store a raw material liquid;
a cover provided at a top portion of the raw material liquid tank and configured to block an opening formed on a top surface of the raw material liquid tank;
a carrier gas source connected to the raw material liquid tank through a carrier gas supply path;
a taking-out path provided inside the cover, an end of the taking-out path being connected to the vapor-phase portion and the other end of the taking-out path being connected to a processing gas supply path to supply the processing gas to a substrate provided outside of the apparatus for generating the processing gas through the processing gas supply path;
a first temperature controller having a square column shape to cover a side wall and a bottom wall of the raw material liquid tank;
a second temperature controller having a plate shape to cover an upper surface of the cover;
a raw material liquid supplying path provided between a raw material liquid bottle that stores the raw material liquid and the raw material liquid tank and configured to supply the raw material liquid into the raw material liquid tank from the raw material liquid bottle, and including a supply pipe through which the raw material liquid is supplied to the raw material liquid tank; and
a raw material liquid temperature controller provided from an outside of a sidewall surface of the first temperature controller to an inside of the raw material liquid tank,
supplying, by the raw material liquid supplying path, the raw material liquid into the raw material liquid tank from the raw material liquid bottle;
supplying, by the carrier gas source, a carrier gas to the raw material liquid supplied to the raw material liquid tank to generate the processing gas by bubbling the raw material liquid with the carrier gas;
taking out, by the taking-out path, the processing gas generated by bubbling the raw material liquid with the carrier gas from the vapor-phase portion above the liquid-phase portion;
supplying, by the processing gas supply path, the processing gas to the substrate provided outside of the apparatus for generating the processing gas through the processing gas supply path;
performing, by the first temperature controller, a temperature adjustment of the raw material liquid of the liquid-phase portion through at least one of the side wall and the bottom wall of the raw material liquid tank;
performing, by the second temperature controller, a temperature adjustment of the vapor-phase portion through the upper surface of the cover such that a temperature of the vapor-phase portion is higher than a temperature of the liquid-phase portion, and adjusting, by the raw material liquid temperature controller, a temperature of the raw material liquid such that the temperature of the raw material liquid supplied to the raw material liquid tank approaches the temperature of the liquid-phase portion.

11. The method of claim 10, further comprising:
providing the raw material liquid temperature controller including a preliminary temperature controller provided on the sidewall surface of the first temperature controller, and provided with a spiral pipe formed by winding a portion of the raw material liquid supplying path in a spiral shape such that an outer peripheral surface and an inner peripheral surface of the spiral pipe arranged an inside and an outside in a radial direction are in contact with each other to transfer heat through the outer peripheral surface and the inner peripheral surface of the spiral pipe,
wherein the adjusting of the temperature of the raw material liquid includes adjusting, by the preliminary temperature controller, the temperature of the raw material liquid to approach the temperature of the liquid-phase portion at an outside of the raw material liquid tank.

12. The method of claim 11, further comprising:
providing the raw material liquid temperature controller further including a heat exchanging unit provided inside of the raw material liquid tank and constituted by a terminal end side of the supply pipe disposed to be immersed in the raw material liquid of the liquid-phase portion,
wherein the adjusting of the temperature of the raw material liquid includes performing, by the heat exchanging unit, a heat exchange between the raw material liquid flowing at the terminal end side of the supply pipe and the liquid-phase portion such that the temperature of the raw material liquid supplied to the raw material liquid tank approaches the temperature of the liquid-phase portion.

13. A substrate processing method, comprising:
disposing a substrate in a processing container; and
supplying a processing gas generated by the method of claim 10 into the processing container to process the substrate,
wherein the processing gas is a solvent vapor used for processing the substrate having a pattern mask formed thereon by exposing and developing the substrate to improve a roughness of the pattern mask.

14. A non-transitory storage medium storing a computer program used in an apparatus for generating a processing gas for processing a substrate,
wherein the computer program includes steps organized to perform the method of claim 10.

* * * * *